US009209416B2

(12) United States Patent
Yang et al.

(10) Patent No.: US 9,209,416 B2
(45) Date of Patent: Dec. 8, 2015

(54) ELECTROLUMINESCENT ELEMENT, DISPLAY DEVICE AND METHOD FOR PREPARING ELECTROLUMINESCENT ELEMENT

(71) Applicant: BOE Technology Group Co., Ltd., Beijing (CN)

(72) Inventors: Dongfang Yang, Beijing (CN); Pil Seok Kim, Beijing (CN); Tian Xiao, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 13/995,489

(22) PCT Filed: Nov. 23, 2012

(86) PCT No.: PCT/CN2012/085214
§ 371 (c)(1),
(2) Date: Jun. 18, 2013

(87) PCT Pub. No.: WO2013/159514
PCT Pub. Date: Oct. 31, 2013

(65) Prior Publication Data
US 2014/0054571 A1 Feb. 27, 2014

(30) Foreign Application Priority Data
Apr. 25, 2012 (CN) .......................... 2012 1 0124408

(51) Int. Cl.
H01L 29/08 (2006.01)
H01L 51/50 (2006.01)
H01L 51/56 (2006.01)

(52) U.S. Cl.
CPC ........ *H01L 51/5012* (2013.01); *H01L 51/5004* (2013.01); *H01L 51/5044* (2013.01); *H01L 51/56* (2013.01)

(58) Field of Classification Search
CPC . H01L 51/5012; H01L 51/56; H01L 51/5004; H01L 51/5044
USPC ............................................... 257/40; 438/82
See application file for complete search history.

(56) References Cited

U.S. PATENT DOCUMENTS

2006/0084347 A1 4/2006 Tutt et al.
2007/0188083 A1 8/2007 Iwakuma et al.
(Continued)

FOREIGN PATENT DOCUMENTS

CN 10906976 A 1/2007
CN 101055923 A 10/2007
(Continued)

OTHER PUBLICATIONS

International Search Report (Chinese language) issued by the International Searching Authority, rendered Apr. 25, 2012, 14 pages.
(Continued)

*Primary Examiner* — Douglas Menz

(57) ABSTRACT

Disclosed are an electroluminescent element, a display device and a method for preparing the electroluminescent element. The electroluminescent element comprises a substrate (101) and an anode layer (102), a light-emitting layer (103) and a cathode layer (104) that are disposed in sequence on the substrate (101). At least one insertion layer (105) for adjusting electron mobility is disposed within the light-emitting layer (103). By disposing an insertion layer (105) in the light-emitting layer (103), the effect of a voltage on the recombination of electrons and holes in the light-emitting layer (103) can be reduced, the level of the recombination of carriers such as electrons and holes in the light-emitting layer (103) can be increased, and the ratio of electrons and holes that are combined can be increased.

8 Claims, 2 Drawing Sheets

(56) References Cited

U.S. PATENT DOCUMENTS

2007/0235742 A1* 10/2007 Tobise et al. .................. 257/79
2007/0241676 A1 10/2007 Park et al.

FOREIGN PATENT DOCUMENTS

CN 102651454 A 8/2012
JP 2002313553 A 10/2002

OTHER PUBLICATIONS

The State Intellectual Property Office of the People's Republic of China ("SIPO") (Chinese Language) Office Action issued on Jul. 30, 2013 by SIPO in Chinese Patent Application No. 201210124408.0; six (6) pages.
English Translation of The State Intellectual Property Office Of The People's Republic Of China ("SIPO") Office Action issued on Jul. 30, 2013 by SIPO in Chinese Patent Application No. 201210124408.0; four (4) pages.
Espacenet Bibliographic Data, Abstract of CN1906976(A), 1 page.
English abstract of JP2002313553(A), 10 pages.
Espacenet Bibliographic Data, Abstract of CN101055923(A), 2 pages.
Espacenet Bibliographic Data, Abstract of CN102651454(A), 1 page.
The State Intellectual Property Office of the People's Republic of China ("SIPO") (Chinese Language) Office Action issued on Apr. 10, 2014 by SIPO in Chinese Patent Application No. 201210124408.0; four (4) pages.
Third Office Action issued by the Chinese Patent Office for Chinese Patent Application No. 201210124408.0 dated Aug. 5, 2014, 5pgs.
English translation of Third Office Action issued by the Chinese Patent Office for Chinese Patent Application No. 201210124408.0 dated Aug. 5, 2014, 6pgs.
International Preliminary Report on Patentability issued by The International Bureau of WIPO on Oct. 28, 2014 for International Application No. PCT/CN2012/085214, 8 pages.

* cited by examiner

ELECTROLUMINESCENT ELEMENT, DISPLAY DEVICE AND METHOD FOR PREPARING ELECTROLUMINESCENT ELEMENT

CROSS REFERNCE TO RELATED APPLICATIONS

This application is based on International Application No. PCT/CN2012/085214 filed on Nov. 23, 2012, which claims priority to Chinese national Application No. 201210124408.0 filed on Apr. 25, 2012, the contents of which are incorporated herein by reference.

TECHNICAL FIELD

Embodiments of the invention relate to an electroluminescent element, a display device and a method for preparing the electroluminescent element.

BACKGROUND

Organic light-emitting diode (OLED) display is also called organic electroluminescent display, which differs in the way of display from traditional liquid crystal display (LCD). An OLED does not need a backlight and is formed with a very thin light-emitting layer and a substrate. Therefore, an OLED display device can be made lighter, thinner, with wider viewable angle, and significantly save electric energy. Therefore, the OLED display device is becoming more and more popular.

FIG. 1 is the schematic diagram of the electroluminescent element in prior art. As shown in FIG. 1, the electroluminescent element in prior art comprises a substrate 101, and an anode layer 102, a light-emitting layer, and a cathode layer 104 that are formed in sequence on the substrate 101, with the anode layer 102 and the cathode layer 104 being respectively connected to the positive and negative electrodes of a power supply. The substrate 101 may be a glass substrate, a polyester substrate, or a polyimide compound substrate, etc.; the anode layer 102 can employ an inorganic metal oxide, such as indium tin oxide (ITO), zinc oxide (ZnO), etc., as well as a high work function metal material, such as gold, copper, silver, platinum, etc.; the cathode layer 104 can employ a low work function metal material, such as lithium, magnesium, calcium, strontium, aluminum, indium, etc.; and the material for the light-emitting layer can include a fluorescent material, such as NPB (N,N'-diphenyl-N,N'-bis(1-naphthyl-phenyl)-1, 1'-biphenyl-4,4'-diamine), DPVBI (4,4'-bis(2,2-disphenylvinyl)biphenyl), etc.

In prior art, researchers primarily focused on obtaining high efficiency organic electroluminescent element by exploiting triplet excitons and singlet excitons. However, since the transport of carriers is not ideal, carriers may be injected under a unbalance state, the injected carriers may not be recombined a hundred percent for luminescence, and the excitons formed by the recombination of carriers may even be quenched, which all causes the actual efficiency far lower than the maximal theoretical value. Meanwhile, when a voltage is applied to the light-emitting layer 103 via the anode layer 102 and the cathode layer 104, the hole mobility is higher than the electron mobility. However, with the increase of voltage, the increase of the electron mobility will be faster than the increase of the mobility of the hole mobility, so the position of the recombination zone in the light-emitting layer will change along with the change of the voltage, resulting in notable change of the color of the element along with the change of the voltage. If elements doped with P and N dopants, as well as the light-emitting layer is formed using a matrix material favoring electron transport and there is only a single recombination zone, then the light-emitting layer will be closer to the hole transport layer. This will also cause extra excitons spread to the hole transport layer, resulting in non-radiative decay and the quantity mismatch between the carriers such as electrons and holes in the light-emitting layer 103 and reducing the light-emitting efficiency of the light-emitting layer 103, which is detrimental to the improvement of the efficiency of the element.

SUMMARY

Embodiments of the invention provide an electroluminescent element, a display device and a method for preparing the electroluminescent element for reducing the effect of change in voltage on the recombination zone, and solving the following problems in prior art: quantity mismatch between the electrons and holes in the light-emitting layer, low light-emitting efficiency of the light-emitting layer, and change of color with change of voltage.

One aspect of the invention provides an electroluminescent element, comprising a substrate and an anode layer, a light-emitting layer and a cathode layer that are disposed in sequence on the substrate, with the anode layer and the cathode layer being connected to the anode and the cathode of a power supply, respectively. At least one insertion layer for adjusting electron mobility is disposed within the light-emitting layer.

For this electroluminescent element, for example, the insertion layer is used to block electron transport, causing the quantity of electrons to match that of holes in the light-emitting layer.

For this electroluminescent element, for example, the insertion layer has a thickness between 1 and 20 nm.

For this electroluminescent element, for example, the lowest unoccupied molecular orbital (LUMO) of the insertion layer is higher than the LUMO of the light-emitting layer, its highest occupied molecular orbital (HOMO) is equal to or lower than the HOMO of the light-emitting layer, and the electron mobility is lower than the hole mobility in the insertion layer.

For this electroluminescent element, for example, a material for the insertion layer include at least one of aromatic diamine compounds, triphenylamine compounds, aromatic triamine compounds, benzidine derivatives, triarylamine polymers\metal complexes and carbazole polymers.

For this electroluminescent element, for example, the disposition of the insertion layer within the light-emitting layer comprises disposing an insertion layer within the light-emitting layer, the insertion layer dividing the light-emitting layer into a first light-emitting sub-layer and a second light-emitting sub-layer, wherein the thickness of each of the first-emitting sub-layer and the second light-emitting sub-layer account for a range of 1-99% of a thickness of the light-emitting layer.

For this electroluminescent element, for example, the disposition of the insertion layer within the light-emitting layer comprises disposing at least two insertion layers within the light-emitting layer, the at least two insertion layer dividing the light-emitting layer into at least three light-emitting sub-layers, wherein the thickness of each of the light-emitting sub-layers accounts for a range of 1-99% of a thickness of the light-emitting layer.

For this electroluminescent element, for example, the electroluminescent element further comprises an electron transport layer and a hole transport layer, the electron transport layer being provided between the cathode layer and the light-emitting layer, and the hole transport layer being provided between the anode layer and the light-emitting layer.

For this electroluminescent element, for example, the electroluminescent element further comprises an electron and exciton blocking layer, a hole and exciton blocking layer, the electron and exciton blocking layer being disposed between the hole transport layer and light emitting layer, and the hole and exciton blocking layer being disposed between the electron transport layer and light emitting layer.

Another aspect of the invention further provides a display device comprising any one of the aforementioned electroluminescent elements.

Yet another aspect of the invention further provides a method for preparing the electroluminescent element comprising disposing an anode layer, a light-emitting layer and a cathode layer in sequence on the substrate, wherein the light-emitting layer comprises at least a first light-emitting sub-layer and a second light-emitting sub-layer, and the light-emitting layer comprises at least one insertion layer for adjusting electron mobility. The preparation of the light-emitting layer and the insertion layer comprises preparing the first light-emitting sub-layer; depositing an insertion layer on the first light-emitting sub-layer; and preparing the second light-emitting sub-layer on the insertion layer.

Embodiments of the invention provide an electroluminescent element and a method for preparing the same by disposing an insertion layer in the light-emitting layer to reduce the effect of voltage on the recombination of electrons and holes in the light-emitting layer, increase the level of the recombination of carriers such as electrons and holes in the light-emitting layer, increase the ratio of electrons and holes that recombined so as to increase the light-emitting efficiency of the light-emitting layer and meanwhile also facilitate to extend the use life of the electroluminescent element and stabilize of the color generated by the electroluminescent element.

BRIEF DESCRIPTION OF THE DRAWINGS

In order to more clearly illustrate the technical solutions of the embodiments of the present invention, figures of the embodiments will be briefly introduced below. Apparently, the figures in the following description merely relate to some embodiments of the present invention and are not limiting the present invention.

DETAILED DESCRIPTION

In order to make the object, technical solutions and advantages of the embodiments of the invention more clear, the technical solutions of the embodiments of the present invention are clearly and completely described below in relation to the figures of the embodiments of the present invention. Apparently, the embodiments described are merely some, rather than all embodiments of the present invention. Based on the embodiments of the invention described, any other embodiments obtained by a person of ordinary skill in the art without resorting to creative labor are within the scope of the present invention.

Unless otherwise defined, the technical or scientific terms used herein shall have the usual meaning understood by a person of ordinary skill in the art of the present invention. The wordings such as "first", "second" and the like used in the description and claims of the present invention by no means indicates any order, quantity or significance, but are merely used to distinguishing different components. Also, terms such as "a", "an", "the" or the like do not indicate limitation of quantity, either, but rather indicate the existence of at least one. The wording "comprise", "include" or the like indicates elements or objects preceding the "comprise" or "include" encompass the elements or objects enumerated following the "comprise" or "include", or their equivalent, but does not exclude other elements or objects. Terms such as "link", "connect" or the like are not limited to physical or mechanical connection, but can encompass electric connection, no matter direct or indirect. "On", "under", "left" and "right", etc. are merely used to indicate relative positions, and when the absolute position of the object in question changes, these relative positions may change accordingly.

Figure 1:
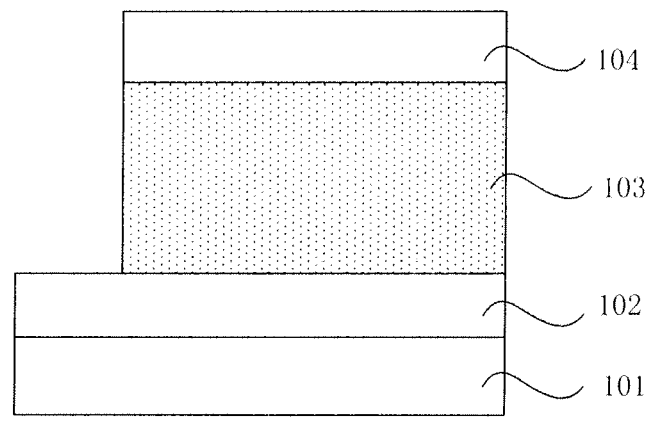
FIG. 1 is a schematic diagram of the structure of the electroluminescent element in prior art.
Figure 2:
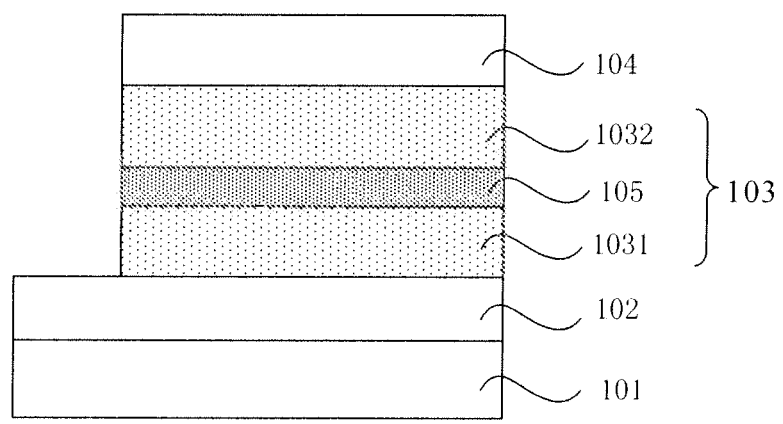
FIG. 2 is a schematic diagram of the structure of a first embodiment of the electroluminescent element of the invention.

FIG. 2 is a schematic diagram of the structure of a first embodiment of the electroluminescent element of the invention. As shown in FIG. 2, the electroluminescent element of this embodiment comprises in sequence a substrate 101 and an anode layer 102, a light-emitting layer 103 and a cathode layer 104 that are formed in sequence on the substrate 101. The light-emitting layer 103 comprises a first light-emitting sub-layer 1031 and a second light-emitting sub-layer 1032. An insertion layer 105 is disposed between the first light-emitting sub-layer 1031 and the second light-emitting sub-layer 1032 for adjusting electron transport so that the quantity of electrons match that of holes in the light-emitting layer.

The position of the insertion layer 105 can be defined by the thickness ratio of the first light-emitting sub-layer 1031 to the second light-emitting sub-layer 1032. As an option, the thickness of each of the first light-emitting sub-layer 1031 and the second light-emitting sub-layer 1032 can account for 1-99% of the total thickness of the light-emitting layer, and the sum of the ratio of the thickness of the first light-emitting sub-layer 1031 to the total thickness of the light-emitting layer and that of the second light-emitting sub-layer 1032 to the total thickness of the light-emitting layer is 1. The thickness of the insertion layer 105 may be in a range of 1-20 nm. The insertion layer 105 may be, e.g., in the central of the light-emitting layer 103, i.e., the thicknesses of the first light-emitting sub-layer 1031 and the second light-emitting sub-layer 1032 are equal to each other; alternatively, the insertion layer 105 can be, e.g., at the 1/3 position to the thickness of the light-emitting layer, i.e., the thickness of the first light-emitting sub-layer 1031 can be two times as large as the thickness of the second light-emitting sub-layer 1032, or vice versa. The light-emitting layer may be an undoped fluorescent light-emitting layer, an organic material layer doped with a fluorescent material, a doped phosphorescent material, etc.

The substrate 101 may be a glass substrate, a polyester substrate or a polyimide compound substrate, etc. The layer 102 can employ an inorganic metal oxide, such as indium tin oxide (ITO), zinc oxide (ZnO), etc., as well as a high work function metal material, such as gold, copper, silver, platinum, etc.; the cathode layer 104 can employ a low work function metal material, such as lithium, magnesium, calcium, strontium, aluminum and indium, etc.

As examples, the light-emitting layer can be selected as described in the following.

The light-emitting layer 103 may be an undoped fluorescent organic material layer, for example, a light-emitting material having transport capacity such as NPB, Alq3 (8-hydroxyquinoline aluminum), DPVBI (4,4'-bis(2,2-disphenylvinyl)biphenyl), etc.

Optionally, the light-emitting layer 103 may be a doped fluorescent organic material layer, such as one comprising a fluorescent dopant and a matrix material.

Optionally, the light-emitting layer 103 may be a doped phosphorescent organic material layer (comprising a phosphorescent dopant and a matrix material)

Examples of light-emitting materials with transport capacity include NPB, Alq3 and DPVBI.

Examples of fluorescent dopants include coumarin dyes (coumarin 6, C-545T), quinacridones (DMQA), DCM series, etc.

Phosphorescent dopants comprise metal complex light-emitting materials based on Ir, Pt, Ru, Cu, etc., for example, FIrpic, Fir6, FirN4, FIrtaz, Ir(ppy)3, Ir(ppy)2(acac), PtOEP, (btp)2Iracac, Ir(piq)2(acac), (MDQ)2Iracac, etc.

The matrix materials comprise metal complex materials, imidazole materials, phenanthroline derivatives, etc., such as 8-hydroxyquinoline aluminum (Alq3), Liq, bis(2-methyl-8-hydroxyquinoline) (p-phenylphenol) aluminum (Balq), 1,3,5-tris(N-phenyl-benzimidazol-2-yl)benzene (TPBI), BCP, Bphen, 9,10-bis(2-naphthyl)anthracene (ADN), TAZ, CBP, MCP, TCTA (4,4',4''-tris(carbazol-9-yl)triphenylamine), NPB, etc.

The insertion layer 105 has an electron blocking function. As an example, the material for the insertion layer 105 may include at least one of the following materials: aromatic diamine compounds, triphenylamine compounds, aromatic triamine compounds, benzidine derivatives, triarylamine polymers, metal complexes, as well as carbazole polymers. For example, the material for the insertion layer 105 may include organic materials having the electron blocking function such as NPB, TCTA, ADN, TPD (triphenyl diamine), CuPc (copper phthalocyanine), polyvinylcarbazole or monomer thereof, etc., or inorganic materials having the electron blocking function, etc.

The lowest unoccupied molecular orbital (LUMO) of the insertion layer 105 is higher than the LUMO of the light-emitting layer 103, the highest occupied molecular orbital (HOMO) of the insertion layer 105 is equal to or lower than the HOMO of the light-emitting layer 103; of the insertion layer 105, the electron mobility is lower than the hole mobility.

Furthermore, the technique of disposing an insertion layer within the light-emitting layer of the present embodiment can be used in an element with a top emitting structure, for example, top blue light emitting element, organic polymer top emitting element, etc.

In the present embodiment, an insertion layer is disposed in the light-emitting layer to reduce the effect of the applied voltage upon the recombination of electrons and holes in the light-emitting layer, increase the level of the recombination of carriers such as electrons and holes in the light-emitting layer, increase the ratio of electrons and holes that recombined, so as to increase the light-emitting efficiency of the light-emitting layer and meanwhile also facilitate to extend the use life of the electroluminescent element and stabilize the color generated by the electroluminescent element.

Figure 3:
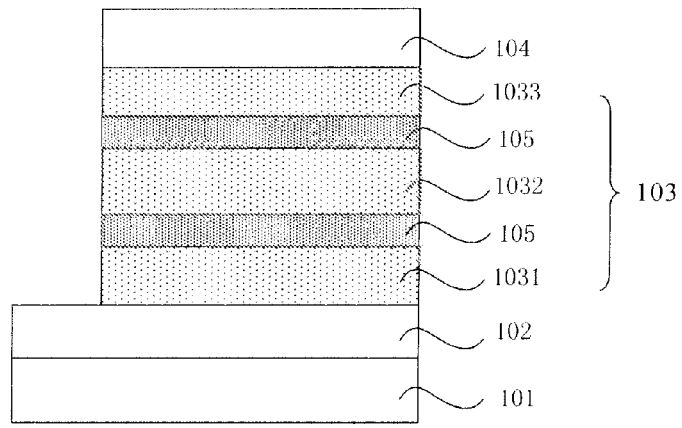
FIG. 3 is a schematic diagram of the structure of a second embodiment of the electroluminescent element of the invention.

FIG. 3 is a schematic diagram of the structure of a second embodiment of the electroluminescent element of the invention. As shown in FIG. 3, the present embodiment has a similar structure and material selection to embodiment 1 for a substrate, an anode, a cathode, a light-emitting layer and an insertion layer. The light-emitting layer 105 comprises two insertion layers 105, which divide the light-emitting layer 103 into three light-emitting sub-layers: a first light-emitting sub-layer 1031, a second light-emitting sub-layer 1032, and a third light-emitting sub-layer 1033. The ratio of the thicknesses between the first light-emitting sub-layer 1031, the second light-emitting sub-layer 1032 and the third light-emitting sub-layer 1033 can be used to define the positions of the insertion layers 105. Optionally, the thickness of each light-emitting sub-layer can account for 1-99% of the thickness of the light-emitting layer, and the sum of the ratios of the thicknesses of the first light-emitting sub-layer 1031, the second light-emitting sub-layer 1032 and the third light-emitting sub-layer 1033 to the total thickness of the light-emitting layer is 1; for example, the first light-emitting sub-layer 1031, the second light-emitting sub-layer 1032 and the third light-emitting sub-layer 1033 can have a same thickness. The thickness of each of the two insertion layers 105 may be in a range of 1-20 nm, for example, 3 nm and 5 nm, respectively. In other examples, three or more insertion layers 105 can be disposed in the light-emitting layer depending on the electron mobility or hole mobility in the light-emitting layer to increase the level of the recombination of electrons and holes in the light-emitting layer and increase the ratio of electrons and holes that are recombined.

In this embodiment, an undoped fluorescent material includes NPB or DPVBI; the matrix material of the doped fluorescent material and doped phosphorescent material may include metal complex materials, imidazole materials, phenanthroline derivatives, etc.; fluorescent dopants include coumarin dyes (coumarin 6, C-545T), quinacridones (DMQA), etc.; and phosphorescent dopants are metal complex light-emitting material based on Ir, Pt, Ru, Cu, etc., for example, FIrpic, Fir6, FirN4, FIrtaz, Ir(ppy)3, Ir(ppy)2(acac), PtOEP, (btp)2Iracac, Ir(piq)2(acac), (MDQ)2Iracac, etc.

Similarity, the LUMO of the insertion layer 105 is higher than the LUMO of the light-emitting layer, the HOMO of the insertion layer 105 is equal to or lower than the HOMO of the light-emitting layer, and the electron mobility is lower than the hole mobility in the insertion layer 105.

Figure 4:
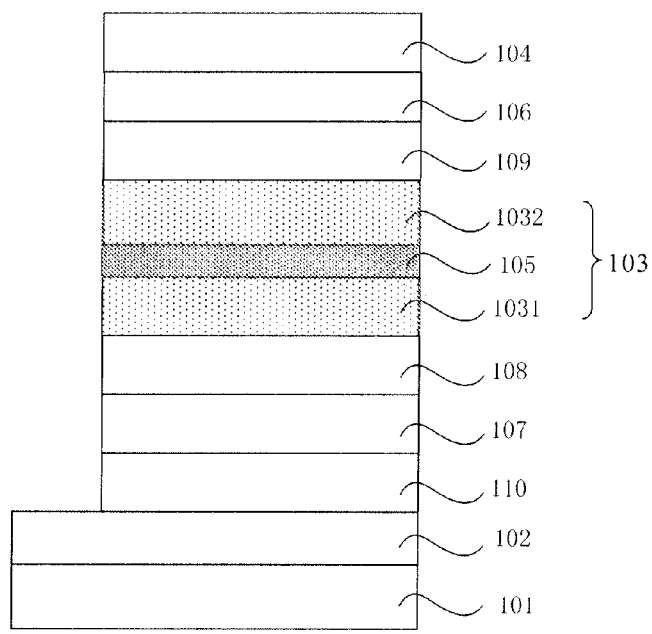
FIG. 4 is a schematic diagram of the structure of a third embodiment of the electroluminescent element of the invention.

FIG. 4 is a schematic diagram of the structure of a third embodiment of the electroluminescent element of the invention. As shown in FIG. 4, in addition to the substrate 101, the anode layer 102, the light-emitting layer 103, and the cathode layer 104, the electroluminescent element of the present embodiment further comprises an electron transport layer 106 and a hole transport layer 107.

The light-emitting layer 103 comprises an insertion layer 105; the electron transport layer 106 for transporting electrons is provided between the cathode layer 104 and the light-emitting layer 103; and the hole transport layer 107 for transporting holes is provided between the anode layer 102 and the light-emitting layer 103. The electron transport layer 106 and the hole transport layer 107 can ensure that the injected electrons and holes recombine in the light-emitting layer 103, increase the ratio of electrons and holes that are recombined, and increase the light-emitting efficiency of the light-emitting layer.

Furthermore, the electroluminescent element of the present embodiment may further comprise an electron and exciton blocking layer 108 and a hole and exciton blocking layer 109. The electron and exciton blocking layer 108 is provided between the hole transport layer 107 and the light-emitting layer 103, and the hole and exciton blocking layer 109 is provided between the electron transport layer 106 and the light-emitting layer 103. With the blocking effect of the electron and exciton blocking layer 108 and the hole and exciton blocking layer 109 on the carriers and excitons, the quantity of carriers and excitons in the light-emitting layer can be increased, and the light-emitting efficiency of the light-emitting layer can be increased.

Furthermore, the electroluminescent element of the present embodiment may further comprise a hole injection layer 110 which is positioned between the anode layer 102 and the hole transport layer 107 and can increase the quantity of the holes and excitons in the light-emitting layer 103 and increase the light-emitting efficiency of the light-emitting layer.

In the present embodiment, the material for the hole injection layer 110 can employ star-shaped triphenylamine compounds, metal complexes, and P doped organic layer or polymers, such as tris [4-(5-phenyl-2-thienyl)phenyl]amine, 4,4', 4"-tris[2-naphthyl(phenyl)amino]triphenylamine (2-TNATA), 4,4',4"-tris(3-methylphenylanilino)triphenylamine (m-MTDATA), copper phthalocyanine (CuPc) or Pedot:Pss, etc.

The materials for the hole transport layer 103 and the electron and exciton blocking layer 108 can employ aromatic diamine compounds, triphenylamine compounds, aromatic triamine compounds, benzidine derivatives, triarylamine polymers, metal complexes and carbazole polymers, such as NPB, triphenyl diamine, 4,4',4"-tris(carbazol-9-yl)triphenylamine, as well as polyvinylcarbazole or monomer thereof.

The materials for the electron transport layer 106 and the hole and exciton blocking layer 109 can employ metal complex materials, oxadiazole electron transport materials, imidazole materials, phenanthroline derivatives or any mixtures of the aforementioned materials in certain ratios, such as 8-hydroxyquinoline aluminum (Alq3), 8-hydroxyquinoline lithium (Liq), 8-hydroxyquinoline gallium, bis[2-(2-hydroxyphenyl-1)-pyradine] beryllium, 2-(4-diphenyl)-5-(4-tert-butylphenyl)-1,3,4-oxadiazole (PBD), 1,3,5-tris(N-phenyl-2-benzimidazol-2-yl)benzene (TPBI), BCP, as well as Bphen, etc.

In the present embodiment, the choice for the material for the substrate, the anode, the cathode, the light-emitting layer and the insertion layer may be the same as those in the first and second embodiments.

In the present embodiment, in addition to provision of one or more insertion layers within the light-emitting layer, an electron transport layer and a hole transport layer, as well as an electron and exciton blocking layer and a hole and exciton blocking layer, etc., are disposed on both sides of the light-emitting layer, so as to reduce the effect of an applied voltage upon the recombination of electrons and holes in the light-emitting layer, increase the level of the recombination of carriers such as electrons and holes in the light-emitting layer, increase the ratio of electrons and holes that are recombined, so as to increase the light-emitting efficiency of the light-emitting layer and meanwhile also facilitate to extend the use life of the electroluminescent element and improve the color purity of the light emitted by the electroluminescent element to further stabilize color generated by the electroluminescent element.

Another embodiment of the invention further provides a display device comprising any one of the aforementioned electroluminescent elements. The display device can be, e.g., used in applications such as monitor, TV, cell phone, etc.

In embodiments of the invention, one or more insertion layers, having electron blocking effect in an ultra-thin layer, are inserted into the light-emitting layer. For example, such insertion can be conducted in various colored light-emitting layers in a white light element to improve the color change of the light emitted from the element along with the voltage. Such insertion also may be conducted in a P-i-N element to prevent the recombination zone from moving to the interface between the light-emitting layer and the hole transport layer and reduce the loss of excitons.

Another embodiment of the invention further provides a method for preparing an electroluminescent element to obtain the electroluminescent element as shown in FIG. 2, 3 or 4. The first embodiment of the method for preparing the electroluminescent element of the invention may comprise the following steps.

Step 501, preparing an anode layer on a substrate.

In this step, acetone or deionized water may be chosen for the ultrasonic cleaning of the transparent substrate 101. Then the substrate 11 is dried with dry nitrogen gas. A transparent conductive film (such as ITO) is deposited on the substrate 101, which film is the anode layer 102. Then method proceeds to step 502.

Step 502, preparing a light-emitting layer on the substrate after the aforementioned step.

In this step, the light-emitting layer is prepared in a vacuum chamber with a vacuum degree of $2 \times 10^{-4}$ Pa. A hole injection layer 110, a hole transport layer 107 and an electron and exciton blocking layer 108 are deposited in sequence on the anode layer 102, then the first light-emitting sub-layer 1031, the insertion layer 105 and the second light-emitting sub-layer 1032 are deposited for the light-emitting layer, and then a hole and exciton blocking layer 109 and an electron transport layer 106 are deposited on the second light-emitting sub-layer 1032. The insertion layer 105, e.g., employs TCTA with a thickness of 4 nm and the thickness of the first light-emitting sub-layer 1031 and the second light-emitting sub-layer 1032 may be, e.g., 4 nm and 6 nm, respectively. The deposition rate of the aforementioned organic layers may be 0.08 nm/s.

The processes of successive deposition of the hole injection layer 110, the hole transport layer 107 and the electron and exciton blocking layer 108, as well as the processes of deposition of the hole and exciton blocking layer 109 and the electron transport layer 106 on the second light-emitting sub-layer 1032 in step 502 can be omitted.

Step 503, preparing a cathode layer on the substrate after the aforementioned steps.

In this step, the cathode layer 104 is prepared on the substrate after the aforementioned steps. The cathode layer 104 may employ a metal material such as lithium, magnesium, calcium, strontium or aluminum, etc., with a thickness of, e.g., 200 nm.

For example, more than one insertion layer 105 can be prepared in the light-emitting layer so as to divide the light-emitting layer into at least three light-emitting sub-layers to reduce the effect of a voltage on the recombination of electrons and holes in the light-emitting layer, increase the level of quantity of carriers such as electrons and holes recombined in the light-emitting layer, and increase the ratio of the electrons and holes recombined.

By providing one or more insertion layers in the light-emitting layer to balance the injection of carriers, the embodiment can reduce the effect of the voltage on the recombination of electrons and holes in the light-emitting layer, increase the level of the recombination of carriers such as electrons and holes in the light-emitting layer, increase the ratio of electrons and holes that are recombined, so as to increase the light-emitting efficiency of the light-emitting layer and meanwhile also facilitate to extend the use life of the electroluminescent element and make the color purity of the element more stable.

The second embodiment of the method for preparing the electroluminescent element of the invention is illustrated as follows with reference to FIGS. 3 and 4.

Step 601, cleaning a substrate.

In this step, acetone or deionized water may be chosen for the ultrasonic cleaning of the transparent substrate 101. Then the substrate 11 is dried with dry nitrogen gas.

Step 602, depositing an anode layer on the substrate.

In this step, a transparent conductive film (for example ITO) is deposited on the substrate 101. This conductive film is the anode layer 102. The square resistance of the ITO film is, e.g., 25 Ω/□ (ohm per square).

Step 603, performing UV light treatment on the substrate after the aforementioned steps.

In this step, the substrate after the aforementioned steps is subject to UV light treatment to further clean the substrate 101 and also increase its work function.

Step 604, preparing in sequence a hole injection layer and a hole transport layer on the substrate after the aforementioned steps.

In this step, for example, the material for the hole injection layer 110 is Meo-TPD:F4TCNQ with a thickness of 100 nm. The material of the hole transport layer 107 is NPB with a thickness of 20 nm.

Step 605, preparing in sequence a first light-emitting sub-layer, an insertion layer, a second light-emitting sub-layer, an insertion layer, and a third light-emitting sub-layer.

In this step, for example, the material for the first light-emitting sub-layer is MADN:DSA-Ph with a thickness of 10 nm, and the materials for both the second light-emitting sub-layer 1032 and the third light-emitting sub-layer 1033 are TPBI: (MDQ)2Ir(acac) with a thickness of 10 nm. Moreover, the material for both insertion layers 105 sandwiching the second light-emitting sub-layer 1032 is TCTA with a thickness of 4 nm.

Step 606, preparing in sequence a hole and exciton blocking layer and an electron transport layer on the substrate after the aforementioned steps.

In this step, for example, the material for the hole and exciton blocking layer 109 is Bphen with a thickness of 10 nm, and the material for the electron transport layer 106 is Bphen:Li with a thickness of 40 nm.

Step 607, preparing in sequence a cathode layer on the substrate after the aforementioned steps.

In this step, for example, a layer of aluminum is deposited on the substrate after the aforementioned steps by way of evaporation deposition at a deposition rate of 1.5 nm/s and a thickness of 200 nm to obtain the cathode layer 104, so as to obtain the electroluminescent element.

Then, a current-voltage-luminosity property test can be conducted on the prepared electroluminescent element. Meanwhile, its emission spectra can be detected and its light-emitting efficiency can be calculated.

For example, the light-emitting layer can also comprise only two light-emitting sub-layers: the first light-emitting sub-layer 1031 and the second light-emitting sub-layer 1032. For example, the material for the first light-emitting sub-layer 1031 is TPBI:Ir(ppy)3 with a thickness of 10 nm; the material for the second light-emitting sub-layer 1032 is CBP:Ir(ppy)3 with a thickness of 20 nm; and one insertion layer 105 is disposed between the two light-emitting sub-layers, the material for which can be TCTA with a thickness of 4 nm.

This embodiment, by disposing one or more insertion layers in the light-emitting layer to balance the injection of carriers, can reduce the effect of a voltage on the recombination of electrons and holes in the light-emitting layer, increase the level of the recombination of carriers such as electrons and holes in the light-emitting layer, increase the ratio of electrons and holes that are recombined, so as to increase the light-emitting efficiency of the light-emitting layer and meanwhile also facilitate to extend the use life of the electroluminescent element and make the color purity of the element more stable.

For a person of ordinary skill in the art, various modifications and improvements can be made without departing from the spirits and essence of the invention, and these modifications and improvements should also be considered as within the scope of the invention.

The invention claimed is:

1. An electroluminescent element, comprising a substrate and an anode layer, a light-emitting layer and a cathode layer that are disposed in sequence on the substrate, with the anode layer and the cathode layer being connected to the anode and the cathode of a power supply, respectively,
   wherein at least two insertion layers for adjusting electron mobility are provided within the light-emitting layer, and the at least two insertion layer divides the light-emitting layer into at least three light-emitting sub-layers, and a thickness of each of the light-emitting sub-layers accounts for a range of 1-99% of a thickness of the light-emitting layer;
   the LUMO of the insertion layer is higher than the LUMO of the light-emitting layer, the HOMO of the insertion layer is equal to or lower than the HOMO of the light-emitting layer, and the electron mobility of the insertion layer is lower than the hole mobility of the insertion layer.

2. The electroluminescent element according to claim 1, wherein the insertion layer is used to block electron transport, causing the quantity of electrons to match that of holes in the light-emitting layer.

3. The electroluminescent element according to claim 1, wherein the insertion layer has a thickness between 1 and 20 nm.

4. The electroluminescent element according to claim 1, wherein a material for the insertion layer includes at least one of aromatic diamine compounds, triphenylamine compounds, aromatic triamine compounds, benzidine derivatives, triarylamine polymers, metal complexes and carbazole polymers.

5. The electroluminescent element according to claim 1, further comprising an electron transport layer and a hole transport layer;
   the electron transport layer is provided between the cathode layer and the light-emitting layer, and the hole transport layer is provided between the anode layer and the light-emitting layer.

6. The electroluminescent element according to claim 5, further comprising an electron and exciton blocking layer, and a hole and exciton blocking layer;
   the electron and exciton blocking layer is disposed between the hole transport layer and light emitting layer, and the hole and exciton blocking layer is disposed between the electron transport layer and light emitting layer.

7. A display device comprising the electroluminescent element according to claim 1.

8. A method for preparing the electroluminescent element comprising disposing an anode layer, a light-emitting layer and a cathode layer in sequence on the substrate, wherein the light-emitting layer comprises at least a first light-emitting sub-layer and a second light-emitting sub-layer, wherein the light-emitting layer comprises at least two insertion layers for adjusting electron mobility, the at least two insertion layer divides the light-emitting layer into at least three light-emitting sub-layers, and a thickness of each of the light-emitting sub-layers accounts for a range of 1-99% of a thickness of the light-emitting layer, and the preparation of the light-emitting layer and the insertion layer comprises:

preparing the first light-emitting sub-layer;

depositing an insertion layer on the first light-emitting sub-layer; and preparing the second light-emitting sub-layer on the insertion layer;

the LUMO of the insertion layer is higher than the LUMO of the light-emitting layer, the HOMO of the insertion layer is equal to or lower than the HOMO of the light-emitting layer, and the electron mobility of the insertion layer is lower than the hole mobility of the insertion layer.

* * * * *